United States Patent [19]

Ruzicka

[11] Patent Number: 5,313,212
[45] Date of Patent: May 17, 1994

[54] TRACK FILTER BIAS ESTIMATION

[75] Inventor: George J. Ruzicka, Los Angeles, Calif.

[73] Assignee: Hughes Aircraft Company, Los Angeles, Calif.

[21] Appl. No.: 964,181

[22] Filed: Oct. 19, 1992

[51] Int. Cl.$^5$ .................. G01S 13/68; G01S 13/72
[52] U.S. Cl. .................. 342/101; 342/95; 342/97; 342/195
[58] Field of Search .............. 342/101, 95, 96, 97, 342/195

[56] References Cited

U.S. PATENT DOCUMENTS

| | | | |
|---|---|---|---|
| 4,144,571 | 3/1979 | Webber | 364/450 |
| 4,494,202 | 1/1985 | Yueh | 364/462 |
| 4,502,650 | 3/1985 | Yueh | 244/3.15 |
| 4,589,610 | 5/1986 | Schmidt | 244/3.19 |
| 4,743,912 | 5/1988 | Enge et al. | 342/390 |
| 4,783,744 | 11/1988 | Yueh | 364/454 |
| 4,954,837 | 9/1990 | Baird et al. | 342/458 |
| 5,001,650 | 3/1991 | Francis et al. | 364/516 |
| 5,075,694 | 12/1991 | Donnangelo et al. | 342/455 |
| 5,128,684 | 7/1992 | Brown | 342/189 |
| 5,149,011 | 9/1992 | Gratt et al. | 244/3.19 |

Primary Examiner—John B. Sotomayor
Attorney, Agent, or Firm—L. A. Alkov; W. K. Denson-Low

[57] ABSTRACT

A radar system including a Kalman filter that processes radar return signals to produces position, velocity, acceleration, gain and residual error output signals, and a post-processor that processes these signals in accordance with a track filter bias estimation procedure. The procedure computes bias estimates and revised position, velocity and acceleration output signals that are corrected for bias error. The revised output signals are coupled to the radar system to track a target. The track filter bias estimation method computes bias estimates in accordance with the relationship:

$$\hat{b} = \begin{pmatrix} \widetilde{Res} \\ R\widetilde{K_1 Res}/T \\ \widetilde{K_2 Res}/T \end{pmatrix}$$

where Res, $K_1/K_2$, R and T denote the residual, gains, range, and filter cycle time, respectively, and the tilde indicates a sample averaging. The present invention also provides for improved maneuver detection by implementing an acceleration estimation algorithm used to track a maneuvering target. The present invention is applicable in all fields and areas where estimation using Kalman filters is used.

4 Claims, 5 Drawing Sheets

TRACK FILTER BIAS ESTIMATION

BACKGROUND

The present invention relates generally to track filtering techniques, and more particularly to a radar system employing a track filter bias estimation method that improves radar target tracking performance.

In target tracking applications, optimal filtering provided by Kalman filtering techniques breaks down during a target maneuver. This is primarily due to the fact that unknown target acceleration or velocity cannot be adequately accounted for in the target model. As a result, the state estimates exhibit bias errors which cause potentially severe performance degradation, especially in angle filter estimates.

Therefore, it is an objective of the present invention to provide for an improved target tracking radar and a track filter bias estimation method that improves the filtering performance of Kalman filtering techniques employed in target tracking radars.

SUMMARY OF THE INVENTION

The present invention comprises a radar system including a radar having an antenna that is adapted to track a moving target, and a signal processor coupled to the radar. The signal processor comprises a Kalman filter that processes radar return signals from the radar and produces position, velocity, acceleration, gain and residual error output signals, and a post-processor coupled to the Kalman filter and to the radar that processes the position, velocity, acceleration gain and residual error output signals in accordance with a predetermined track filter bias estimation procedure. The track filter bias estimation procedure computes bias estimates and computes revised position, velocity and acceleration output signals based on the bias estimates and that are corrected for bias error. The revised position, velocity and acceleration output signals are coupled to the radar in order to maintain target track.

The present invention comprises a track filter bias estimation method that is performed in the post-processor, and the bias estimates are computed in accordance with the relationship:

$$\hat{b} = \begin{pmatrix} \widetilde{Res} \\ R\widetilde{K_1 Res}/T \\ \widetilde{K_2 Res}/T \end{pmatrix}$$

where Res, $K_1/K_2$, R and T denote the residual, gains, range, and filter cycle time, respectively, and the tilde indicates a sample averaging.

The present method comprises the following steps. Radar return signals are produced by the radar system. The radar return signals are processed by a Kalman filter to produce position, velocity, acceleration, gain and residual error output signals. The gain and residual error output signals are processed in a post-processor in accordance with a predetermined track filter bias estimation procedure to compute bias estimates and revised position, velocity and acceleration output signals based on the bias estimates that are corrected for bias error. The revised position, velocity and acceleration output signals are then applied to the radar to maintain target track.

The present invention thus provides a simple method of estimating bias errors using smoothed values of Kalman filter gains and residuals. These bias estimates are then applied to the Kalman filter estimates to yield superior estimation performance. The present bias estimation method helps to eliminate the interlocked problems of track quality indication, track improvement, lags in track estimates, and maneuver detection, particularly in situations where rate estimates from the velocity filter may be unreliable. Significant performance improvement in target tracking is provided by incorporating the present invention in a radar system. In addition to target tracking, radar performance improvements, the present invention has application in all fields and areas where estimation using Kalman filters is used.

The present invention also provides for an angle-based maneuver detector or maneuver detection post-processor and processing method that uses the bias estimates to identify a maneuvering target. The maneuver detection post-processor processes the output signals $a_{TE}'$ and $a_{TD}'$ from the post-processor, and velocity signals $\hat{V}_T$, $\hat{V}_{TE}$, and $\hat{V}_{TD}$, and provides an acceleration estimate output signal $\hat{a}_T$, that is indicative of the true acceleration of the target.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
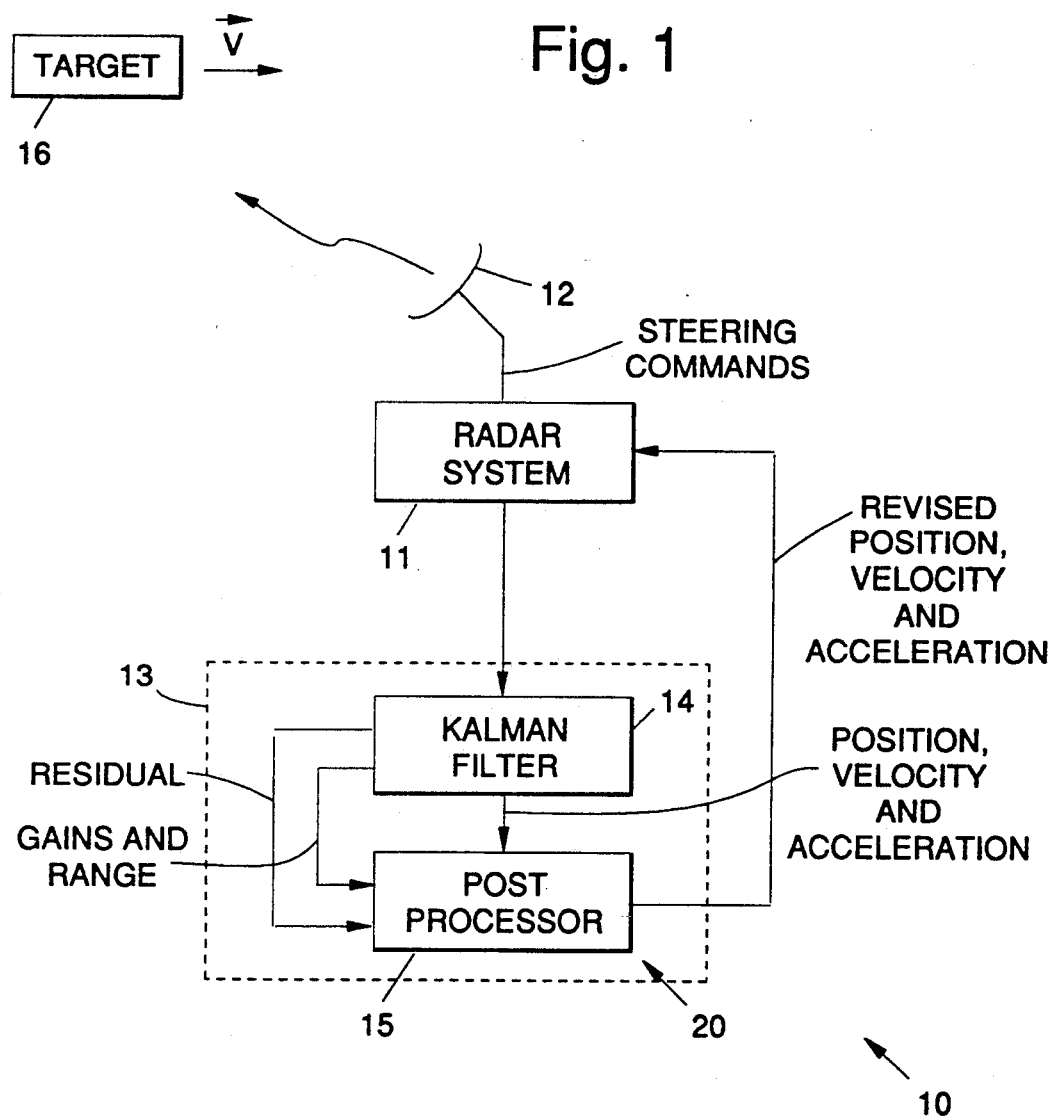
FIG. 1 shows a radar system incorporating a track filter bias estimation method in accordance with the principles of the present invention.
Figure 2:
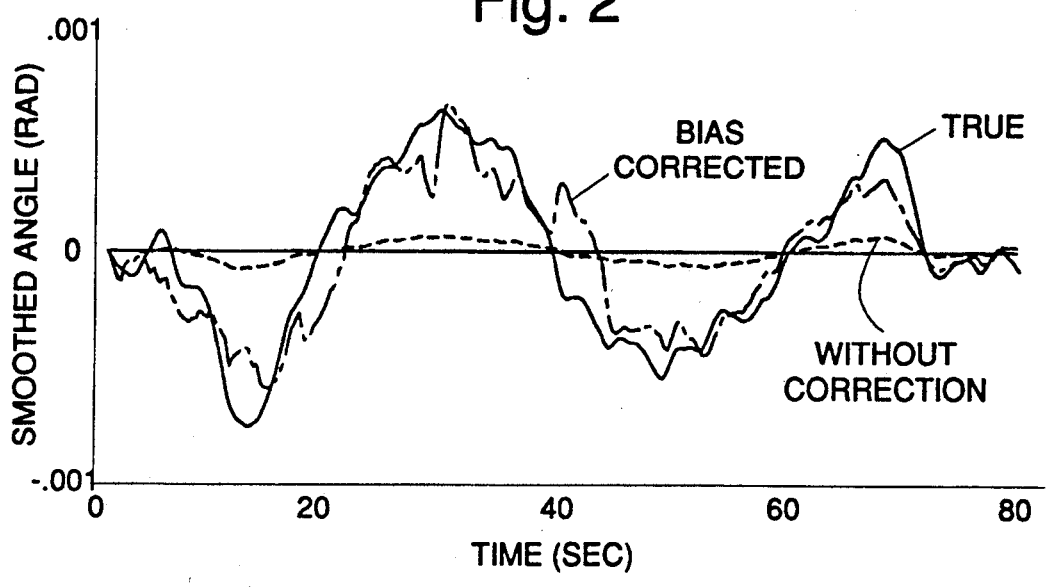
FIG. 2 shows a graph of position (smoothed angle) versus time for a target tracked with and without the track filter bias estimation method of the present invention, along with the true angle.

Referring to the drawing figures, FIG. 1 shows a radar system 10 incorporating a track filter bias estimation method 20 in accordance with the principles of the present invention. The radar system 10 is comprised of a radar 11 having an antenna 12, and a signal processor 13 coupled to the radar 11. The radar 11 is adapted to track a target 16. The signal processor 13 is comprised of a Kalman filter 14 (Kalman angle filter) that processes output signals from the radar 11, and a post processor 15 that implements the track filter bias estimation method.

The Kalman filter 14 processes data generated by the radar 11 and produces position, velocity and acceleration output signals in cross line of sight dimension as an output. In addition, the Kalman filter 14 provides gain and residual error signals as output signals. The position, velocity and acceleration output signals along with the gain and residual error signals are coupled to the post processor 15 that computes bias estimates. The output of the post processor 15 are revised position, velocity and acceleration output signals that are corrected for bias error, and are therefore more accurate. These revised position, velocity and acceleration output signals are fed back to the radar in order to improve the lock on the target 16 to more accurately track it, and in particular, in an electronic countermeasures environment.

In tracking applications involving a single target 16, the optimality of the Kalman angle filter breaks down during a target maneuver, mainly because the unknown target acceleration or velocity is modeled using state noise (a linear target model), or using special nonlinear dynamics (e.g., a fixed plane turn target model). Consequently, due to the inherent inadequacies of the target model, the residual is no longer zero-mean (or white) and the state estimates become biased.

Therefore, and in accordance with the principles of the present invention, the track filter bias estimation method 20 provides for estimating the biases of the Kalman filter 14 observed during target maneuvers. Based on simulations, improved radar system performance is shown when state estimates are adjusted by the bias estimates produced by the track filter bias estimation method 20 of the present invention.

In tracking a maneuvering target 16, the degradation to the performance of the Kalman filter 16 may be quite severe, especially in the acceleration (azimuth/elevation) estimates. FIGS. 2, 3a, 3b, 4a, and 4b show the performance of the Kalman angle filter 16 for an encounter scenario in a horizontal plane, where the target 16, initially head-on, performs a $3\pi$ turn. More particularly, FIGS. 2, 3a, 3b, 4a, and 4b show graphs of position (smoothed angle), cross-velocity, and cross-acceleration versus time, respectively, for the target 16 tracked with and without the track filter bias estimation method 20 of the present invention. Observation of these figures indicates a significant improvement in acceleration performance when bias correction is used.

This can be better understood by examining the estimation error recursive equations employed in the Kalman filter 14. In the derivations below, the following definitions are employed. $e_D$ is azimuth angle. $V_E$ is the relative horizontal cross velocity. $A_{TE}$ is the target azimuth cross acceleration. T is the filter cycle time. R is the range to the target. $\dot{R}$ is the range rate of the target. $\omega_{AD}$ is the antenna angle rate. $V_r$ is the relative line of sight target velocity. $K_1$, $K_2$ and $K_3$ are gains. Res is the residual. $\wedge$ represents an estimate. Other definitions are provided below as necessary.

To be specific, using stabilized antenna coordinates and first order discretization, the true motion of the target 16 is described by: [equ. (1)]

$$\begin{pmatrix} \epsilon_D \\ V_E \end{pmatrix} \leftarrow \begin{pmatrix} 1 - T\dot{R}/R & T/R \\ 0 & 1 \end{pmatrix} \begin{pmatrix} \epsilon_D \\ V_E \end{pmatrix} -$$

$$T \begin{pmatrix} \omega_{AD} \\ a_{IE} + \omega_{AD} V_T \end{pmatrix} + T \begin{pmatrix} 0 \\ a_{TE} \end{pmatrix}$$

with an unknown acceleration, $a_{TE}$, driving the target 16. The estimated target motion provided by the filter 14 is described by: [equ. (2)]

$$\begin{pmatrix} \hat{\epsilon}_D \\ \hat{V}_E \\ \hat{a}_{TE} \end{pmatrix} \leftarrow \begin{pmatrix} 1 - T\dot{R}/R & T/R & 0 \\ 0 & 1 & T \\ 0 & 0 & T_{aG} \end{pmatrix} \begin{pmatrix} \hat{\epsilon}_D \\ \hat{V}_E \\ \hat{a}_{TE} \end{pmatrix} -$$

$$T \begin{pmatrix} \omega_{AD} \\ a_{IE} + \omega_{AD} V_T \\ 0 \end{pmatrix} - \begin{pmatrix} K_1 \\ K_2 \\ K_3 \end{pmatrix} Res$$

with the residual $$Res = \epsilon_{Dm} - \epsilon_D = (\epsilon_D + N_m) - \epsilon_D$$

driving the filter 14, and where $N_m$ denotes the measurement noise.

In order to see how the target acceleration, $a_{TE}$, translates into a residual mean, equations (1) and (2) are combined, which yields $$\begin{pmatrix} \epsilon_D - \hat{\epsilon}_D \\ V_E - \hat{V}_E \\ -\hat{a}_{TE} \end{pmatrix} \leftarrow \begin{pmatrix} 1 - K_1 - T\dot{R}/R & T/R & 0 \\ -K_2 & 1 & T \\ -K_3 & 0 & T_{aG} \end{pmatrix} \begin{pmatrix} \hat{\epsilon}_D \\ \hat{V}_E \\ \hat{a}_{TE} \end{pmatrix} +$$

$$T \begin{pmatrix} 0 \\ a_{TE} \\ 0 \end{pmatrix} - \begin{pmatrix} K_1 \\ K_2 \\ K_3 \end{pmatrix} N_m$$

The bias in the estimates, given by $$b = \begin{pmatrix} \epsilon_D - \overline{\hat{\epsilon}_D} \\ V_E - \overline{\hat{V}_E} \\ a_{TE} - \overline{\hat{a}_{TE}} \end{pmatrix}$$

are obtained by taking the mean in the above recursion, yielding $$\begin{pmatrix} \epsilon_D - \overline{\hat{\epsilon}_D} \\ V_E - \overline{\hat{V}_E} \\ -\overline{\hat{a}_{TE}} \end{pmatrix} \leftarrow \begin{pmatrix} 1 - K_1 - T\dot{R}/R & T/R & 0 \\ -K_2 & 1 & T \\ -K_3 & 0 & T_{aG} \end{pmatrix} \begin{pmatrix} \epsilon_D - \overline{\hat{\epsilon}_D} \\ V_E - \overline{\hat{V}_E} \\ -\overline{\hat{a}_{TE}} \end{pmatrix} \begin{pmatrix} \hat{\epsilon}_D \\ \hat{V}_E \\ \hat{a}_{TE} \end{pmatrix} + T \begin{pmatrix} 0 \\ a_{TE} \\ 0 \end{pmatrix}$$

and the residual mean is, $\overline{\text{Res}} = \epsilon_D - \overline{\hat{\epsilon}_D}$. As expected, for $a_{TE} = 0$, the steady state biases are zero, since the system is already optimal.

If biases (b) in the estimates were known at each filter cycle, the estimation process is improved by defining new estimates $$\begin{pmatrix} \epsilon_D' \\ V_E' \\ a_{TE}' \end{pmatrix} = \begin{pmatrix} \hat{\epsilon}_D \\ \hat{V}_E \\ \hat{a}_{TE} \end{pmatrix} + b$$

Thus, estimating the biases is a key to track improvement, track quality indication, and maneuver detection. This is provided by the track filter bias estimation method 20 in accordance with the principles of the present invention.

The bias in the angle estimate is given by $$b_\epsilon = \epsilon_D - \overline{\hat{\epsilon}_D} = \overline{\text{Res}}.$$

and thus can be readily estimated by:

$$\hat{b}_\epsilon = \widetilde{\text{Res}}$$

where, $$\widetilde{\text{Res}} \leftarrow (1-\alpha)\widetilde{\text{Res}} + \alpha W,$$

and where $$W \leftarrow (1-\alpha)W + \alpha \text{Res}.$$

As for the filter velocity and acceleration biases, their estimates are directly available from equations (1) and (2) above upon taking the mean. The idea is to require that each of these equations be consistent in the mean with the Newtonian equations of motion (i.e., in an intertial frame, displacement rate of change equals velocity, velocity rate of change equals acceleration). Thus, using the above approximations in place of the means values, yields $$\hat{b}_V = \frac{R}{T} \widetilde{K_1 \text{Res}}$$

$$\hat{b}_a = \frac{1}{T} \widetilde{K_2 \text{Res}}.$$

Correspondingly, the post-processor 15 generates the bias-corrected state estimates as $$\begin{pmatrix} \epsilon_D' \\ V_E' \\ a_{TE}' \end{pmatrix} = \begin{pmatrix} \hat{\epsilon}_D \\ \hat{V}_E \\ \hat{a}_{TE} \end{pmatrix} + \begin{pmatrix} \hat{b}_\epsilon \\ \hat{b}_V \\ \hat{b}_a \end{pmatrix}.$$

This is the essence of the present invention.

Figure 6:
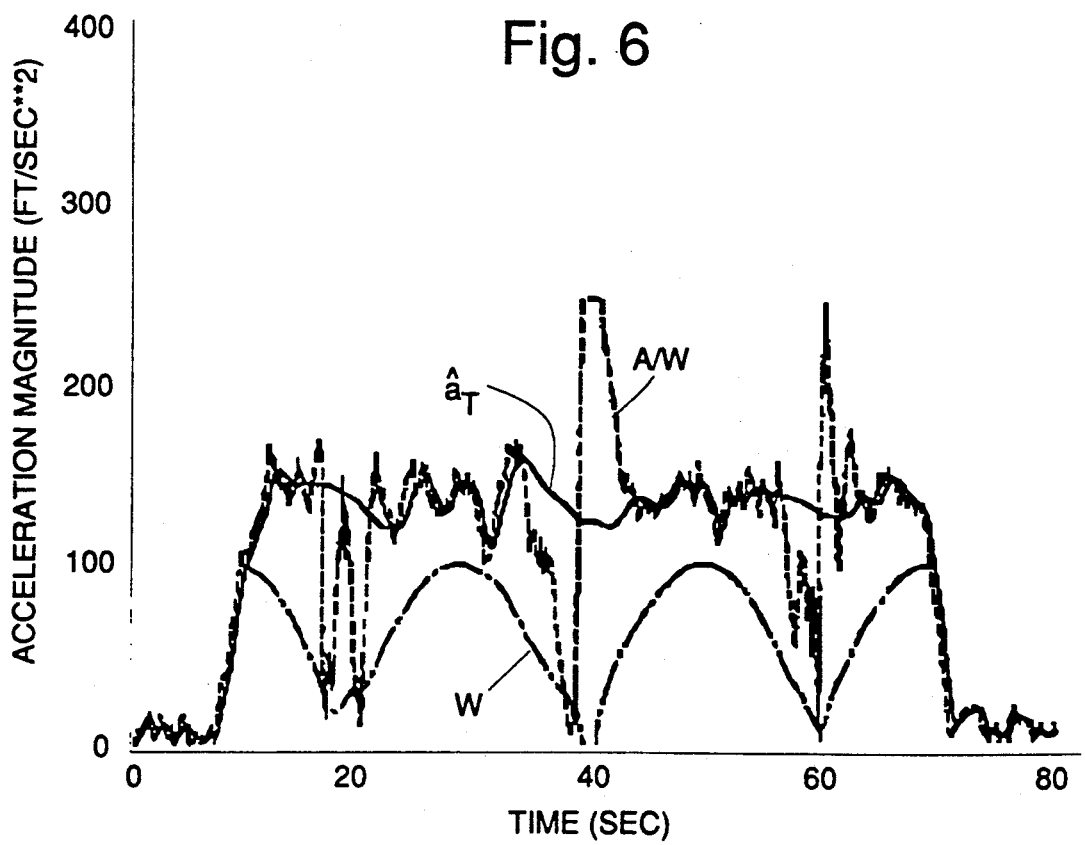
FIG. 6 shows a graph of acceleration magnitude versus time for a maneuvering target using the processor of FIG. 5.
Figure 3A:
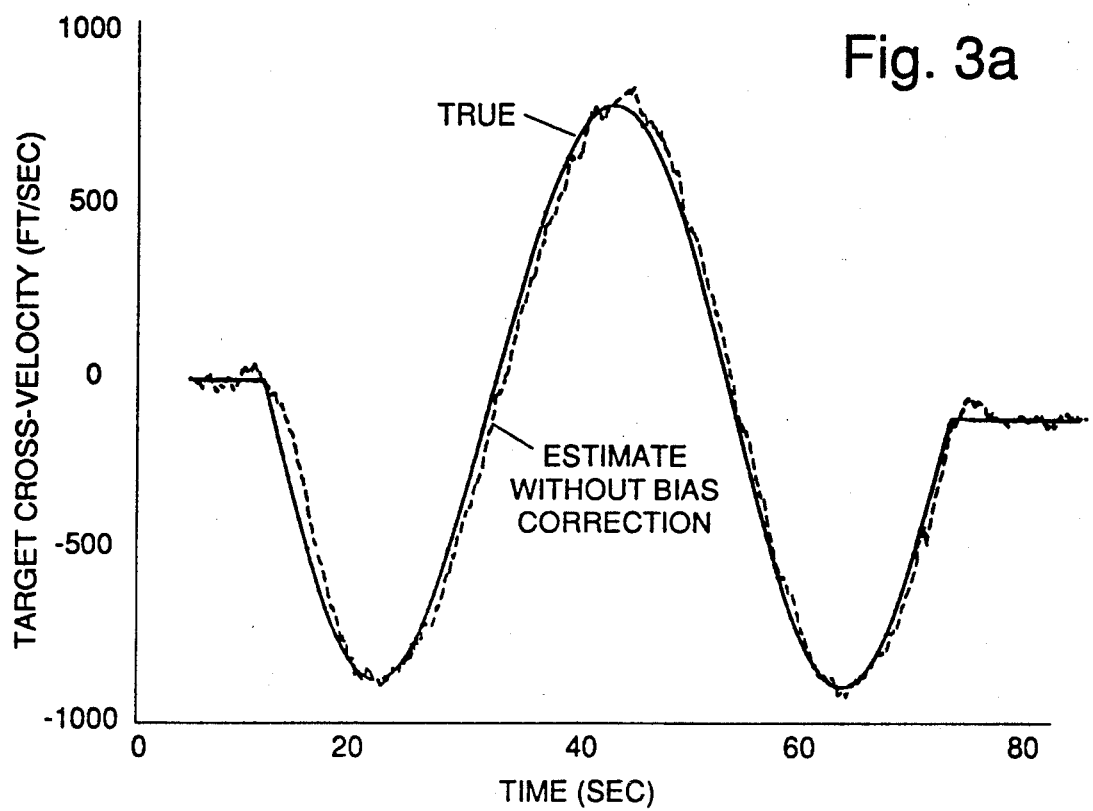
FIGS. 3a and 3b show graphs of cross-velocity versus time for a target tracked with and without the track filter bias estimation method of the present invention, respectively.
Figure 3B:
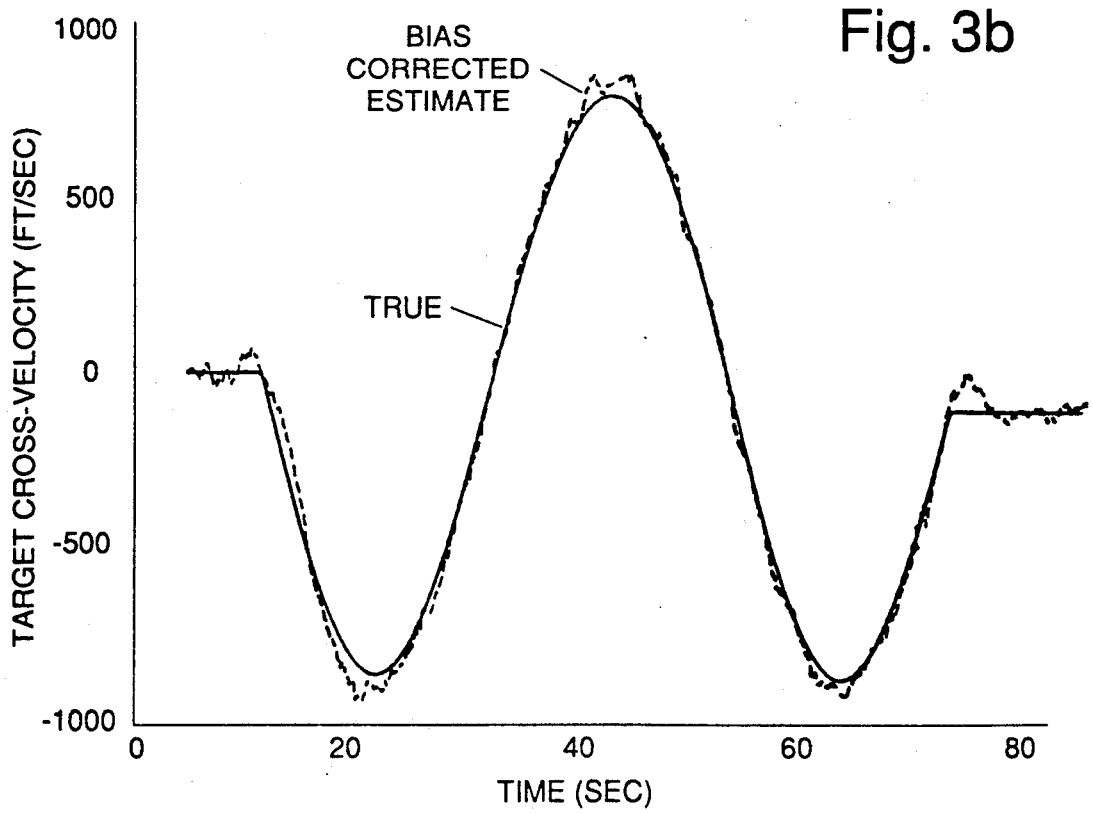
Figure 4A:
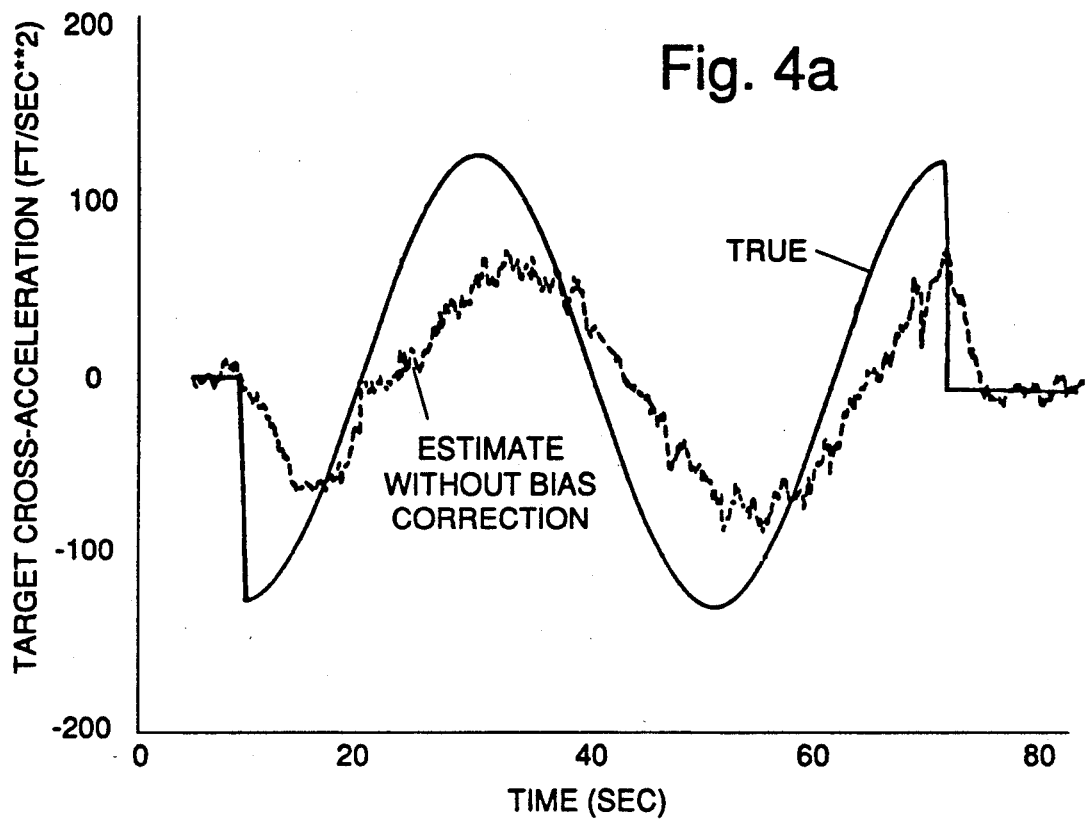
FIGS. 4a and 4b show graphs of cross-acceleration versus time for a target tracked with and without the track filter bias estimation method of the present invention, respectively.
Figure 4B:
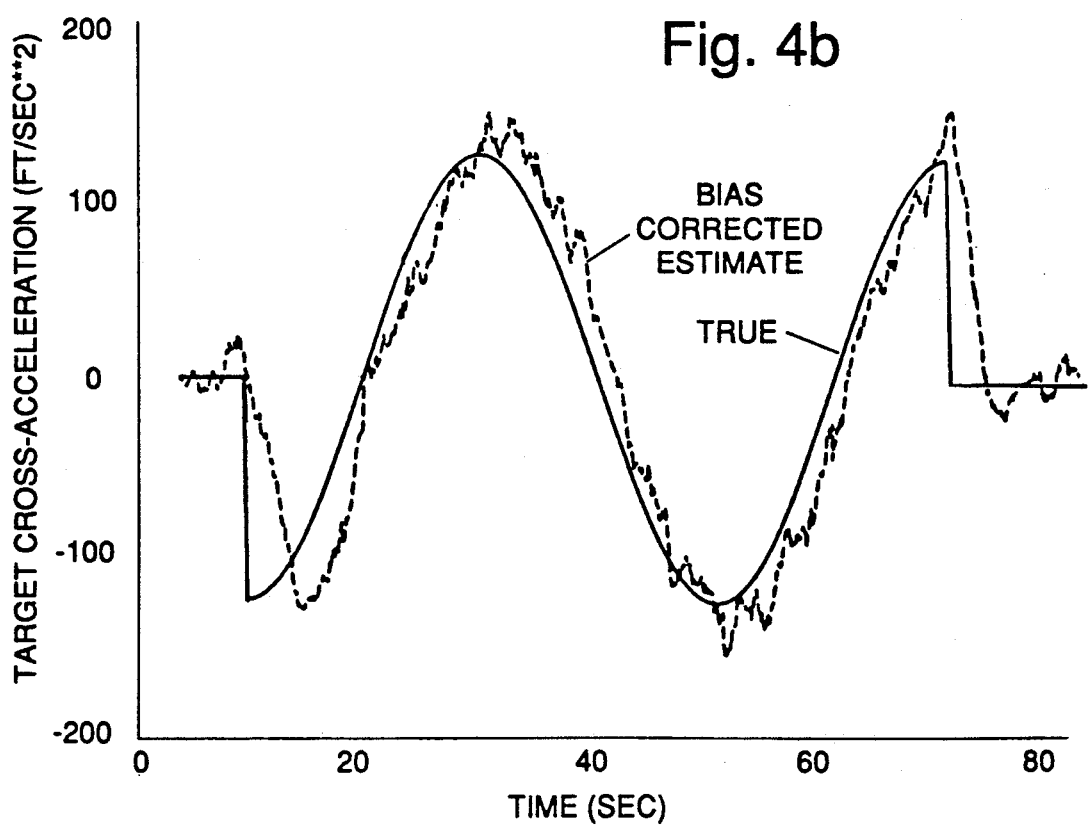
Figure 5:
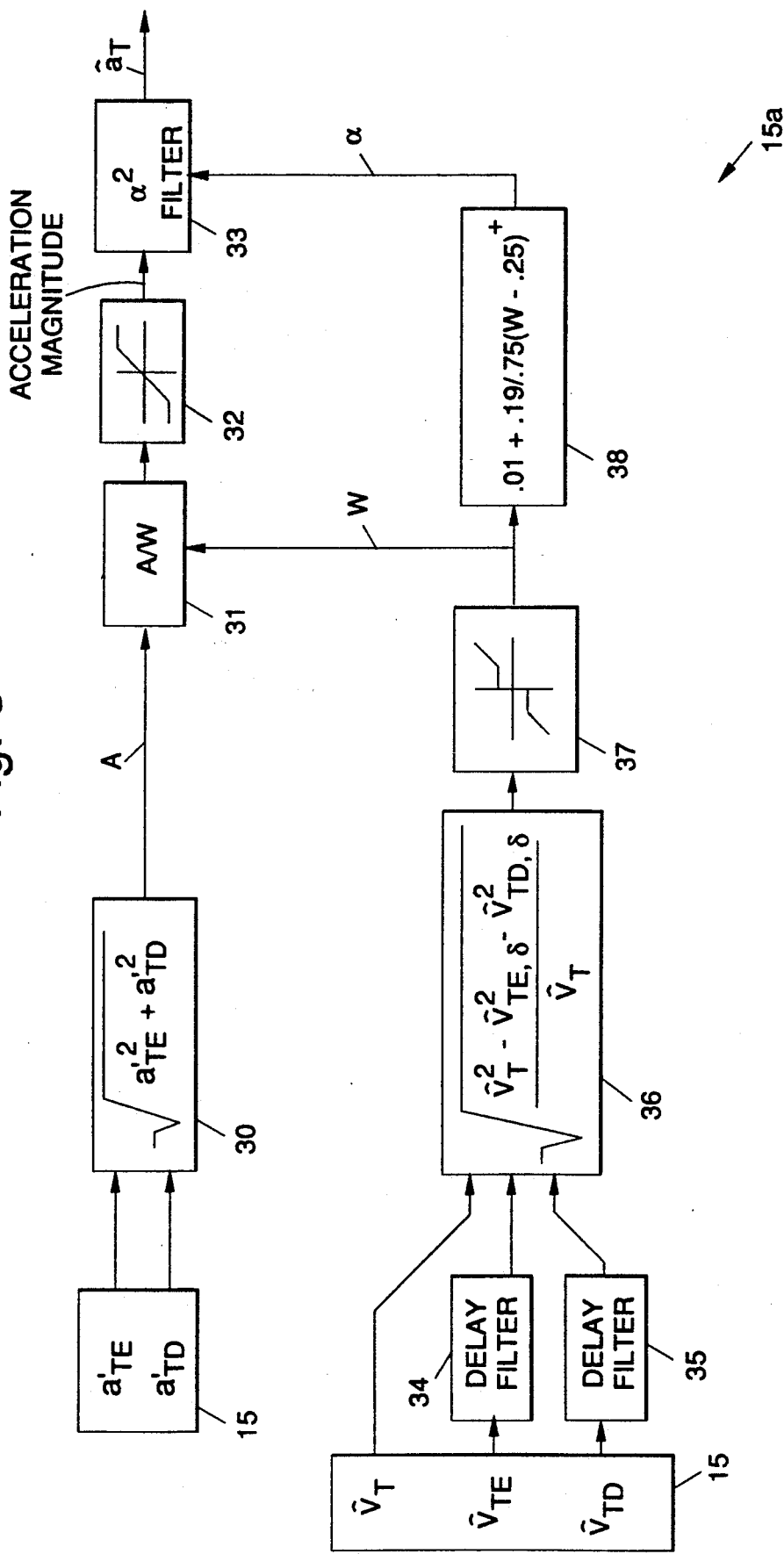
FIG. 5 shows a processor that implements an acceleration magnitude estimation procedure used to declare a maneuvering target in accordance with the present invention.

These estimates are the key to radar tracking improvements provided by the present invention. In operation, and for example, they may be used to provide improved angle based maneuver detection. Such detection is needed when line of sight (LOS) data is corrupted, so that an accurate estimate of LOS acceleration $\hat{a}_{T_r}$ is not available. This kind of maneuver detection will be described with reference to FIGS. 5 and 6. FIG. 5 shows a maneuver detection post-processor 15a that implements acceleration magnitude estimation processing in accordance with the present invention. The post-processor 15a performs processing in addition to that performed by the post-processor 15. The outputs of the post-processor ($a_{TE}$ and $a_{TD}$) are processed as inputs to the maneuver detection post-processor 15a. FIG. 6 shows a graph of acceleration magnitude estimate versus time for the maneuvering target 16.

The novelty of the architecture of the post-processor 15a is the use of $a_{TE}'$ and $a_{TD}'$ instead of $\hat{a}_{TE}$ and $\hat{a}_{TD}$, synchronization of cross-velocity and cross-acceleration estimates, and $\alpha^2$ smoothing with $\alpha$ varying in accordance with beam aspect distance, and where W is given by $$W = \frac{\hat{V}_T^2 + \hat{V}_{TE,\delta}^2 - \hat{V}_{TD,\delta}^2}{\hat{V}_T}.$$

The maneuver detection post-processor 15a processes the output signals $a_{TE}'$ and $a_{TD}'$ from the post-processor 15, and velocity signals $\hat{V}_T$, $\hat{V}_{TE}$, and $\hat{V}_{TD}$, and provides an acceleration estimate output signal $\hat{a}_T$, that is indicative of the true acceleration of the target 16. It is assumed that the target 16 maneuvers at constant speed $V_T$, and its estimate is maintained by the radar 11. The maneuvering detection post-processor 15a comprises means 30 for computing cross acceleration magnitude A. Two delay filters 34, 35 are provided to delay the $\hat{V}_{TE}$, and $\hat{V}_{TD}$ values, and they along with $\hat{V}_T$ are applied to means 36, 37 for computing a beam aspect distance W. Truncating means 37 ensures that W is bounded away from zero. W is then weighted in weighting means 38 using a predetermined weighting equation to produce alpha ($\alpha$). The cross acceleration magnitude A is divided by the beam aspect distance W in a divider 31, to produce a cross acceleration magnitude. Truncating means 32 ensures that the estimates stay within reasonable bounds. The output of the threshold means 32 is applied within reasonable bounds. The output of the threshold means 32 is applied to a low pass filter 33 along with $\alpha$, and the low pass filter 33 produces the target acceleration estimate output signal $\hat{a}_T$.

The delay filters 34, 35 improve synchronization in time between cross acceleration A and beam aspect distance W, whose ratio, A/W, becomes indeterminate (0/0 type) when the target 16 is at beam aspect. Large oscillations in $\hat{a}_T$ may result if the synchronization is poor. Additionally, in order to discount these oscillations, the ratio A/W is truncated and smoothed, so that near the beam aspect, smoothing is heavier.

FIG. 6 shows the performance of the present invention for the horizontal 4G target maneuver algorithm shown in FIG. 5, with $\alpha(W)$ chosen as indicated in FIG. 5.

Thus, there has been described a new and improved target tracking radar system employing a track filter bias estimation method and maneuver detector (acceleration magnitude estimate) that improves radar target tracking performance in detecting a maneuvering target. It is to be understood that the above-described embodiment is merely illustrative of some of the many specific embodiments which represent applications of the principles of the present invention. For example, although the angle filter has been emphasized, the method extends to other filters as well. Clearly, numerous and other arrangements can be readily devised by those skilled in the art without departing from the scope of the invention.

What is claimed is:

1. An angle-based maneuver detection method adapted to process bias-corrected estimates $a_{TE}'$ and $a_{TD}'$ and velocity signals $\hat{V}_T$, $\hat{V}_{TE}$, and $\hat{V}_{TD}$ to provide an acceleration estimate output signal $\hat{a}_T$ that is indicative of a true acceleration of a target, said angle-based maneuver detection method comprising the steps of:

computing a cross acceleration magnetude A of the target in accordance with a predefined relationship;

delaying the $\hat{V}_{TE}$, and $\hat{V}_{TD}$ velocity signals;

computing a beam aspect distance W from the delayed values of $\hat{V}_{TE}$, and $\hat{V}_{TD}$ and $\hat{V}_T$ in accordance with a second predefined relationship;

thresholding W to bound it away from zero;

weighting W using a predetermined weighting equation to produce alpha ($\alpha$);

dividing the cross acceleration magnitude A by the beam aspect distance W to produce a cross acceleration magnitude;

thresholding the cross acceleration magnitude to ensure that the estimates are within predetermined bounds; and low pass filtering the thresholded cross acceleration magnitude to produce the target acceleration estimate output signal $\hat{a}_T$.

2. An angle-based maneuver detector adapted to process bias-corrected estimates $a_{TE}'$ and $a_{TD}'$ and velocity signals $\hat{V}_T$, $\hat{V}_{TE}$, and $\hat{V}_{TD}$ to provide an acceleration estimate output signal $\hat{a}_T$ that is indicative of a true acceleration of a target, said maneuver detector comprising:

means for computing a cross acceleration magnitude A of the target in accordance with a predefined relationship;

means for delaying the $\hat{V}_{TE}$, and $\hat{V}_{TD}$ velocity signals;

means for computing a beam aspect distance W from the delayed values of $\hat{V}_{TE}$, and $\hat{V}_{TD}$ and $\hat{V}_T$ in accordance with a second predefined relationship;

means for thresholding W to bound it away from zero;

means for weighting W using a predetermined weighting equation to produce alpha ($\alpha$);

means for dividing the cross acceleration magnitude A by the beam aspect distance W to produce a cross acceleration magnitude;

thresholding the cross acceleration magnitude to ensure that the estimates stay within predetermined bounds; and means for low pass filtering the threshold cross acceleration magnitude to produce the target acceleration estimate output signal $\hat{a}_T$.

3. A radar system comprising:

a radar having an antenna that is adapted to track a moving target; and a signal processor coupled to the radar that comprises:

a Kalman filter that processes radar return signals from the radar and produces position, velocity, acceleration gain and residual error output signals and a post-processor coupled to the Kalman filter and to the radar that processes the position, velocity, acceleration gain and residual error output signals in accordance with a predetermined track filter bias estimation procedure to compute bias estimates and compute revised position, velocity and acceleration output signals based on the bias estimates and that are corrected for bias error, and wherein the revised position, velocity and acceleration output signals are coupled to the radar in order to track the target, and wherein the post-processor is further adapted to compute bias estimates in accordance with the relationship:

$$\hat{b} = \begin{pmatrix} \widetilde{Res} \\ \widetilde{RK_1 Res/T} \\ \widetilde{K_2 Res/T} \end{pmatrix}$$

where Res, $K_1/K_2$, R and T denote the residual, gains, range and filter cycle time, respectively, and the tilde indicates sample averaging.

4. A radar system comprising:

a radar having an antenna that is adapted to track a moving target; and a signal processor coupled to the radar that comprises:

a Kalman filter that processes radar return signals from the radar and produces position, velocity, acceleration gain and residual error output signals, and a post-processor coupled to the Kalman filter and to the radar that processes the position, velocity, acceleration gain and residual error output signals in accordance with a predetermined track filter bias estimation procedure to compute bias estimates and compute revised position, velocity and acceleration output signals based on the bias estimates and that are corrected for bias error, and wherein the revised positon, velocity and acceleration output signals are coupled to the radar in order to track the target, and wherein the post-processor implements a track filter bias stimation method that comprises the steps of:

estimating angle, velocity and acceleration biases using the equations $$\hat{b}_\epsilon = \widetilde{Res}$$

$$\hat{b}_v = (R/T)\widetilde{K_1 Res}$$

$$\hat{b}_a = (1/T)\widetilde{K_2 Res}$$

where Res, $K_1/K_2$, R and T denote the residual, gains, range, and filter cycle time, respectively, and the tilde indicates sample averaging using an $\alpha^2$ filter of the form $$\text{output} \leftarrow (1-\alpha)\text{output} + \alpha X, \text{ and}$$

$$X \leftarrow (1-\alpha)X + \alpha \text{input},$$

where $\alpha$ is the filter constant and X is a variable.

* * * * *